(12) United States Patent
Wang et al.

(10) Patent No.: US 11,394,861 B2
(45) Date of Patent: Jul. 19, 2022

(54) CAMERA MODULE, MANUFACTURING METHOD THEREOF AND CORRESPONDING INTELLIGENT TERMINAL

(71) Applicant: NINGBO SUNNY OPOTECH CO., LTD., Zhejiang (CN)

(72) Inventors: Mingzhu Wang, Zhejiang (CN); Bojie Zhao, Zhejiang (CN); Zhewen Mei, Zhejiang (CN); Nan Guo, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 281 days.

(21) Appl. No.: 16/636,775

(22) PCT Filed: Jul. 19, 2018

(86) PCT No.: PCT/CN2018/096307
§ 371 (c)(1),
(2) Date: Feb. 5, 2020

(87) PCT Pub. No.: WO2019/029332
PCT Pub. Date: Feb. 14, 2019

(65) Prior Publication Data
US 2020/0382686 A1    Dec. 3, 2020

(30) Foreign Application Priority Data

Aug. 7, 2017   (CN) .......................... 201710666721.X
Aug. 7, 2017   (CN) .......................... 201720978352.3

(51) Int. Cl.
*H04N 5/235*    (2006.01)
*H04N 5/225*    (2006.01)
(Continued)

(52) U.S. Cl.
CPC ........ *H04N 5/2257* (2013.01); *H04M 1/0264* (2013.01); *H04N 5/2253* (2013.01); *H05K 1/02* (2013.01); *H05K 2201/10121* (2013.01)

(58) Field of Classification Search
CPC ...................................................... H04N 5/2257
(Continued)

(56) References Cited

U.S. PATENT DOCUMENTS

2005/0077458 A1    4/2005   Ma et al.
2007/0019102 A1*   1/2007   Nakajo ............ H01L 27/14632
                                                    348/340
(Continued)

FOREIGN PATENT DOCUMENTS

CN      2013-101799      5/2013
CN       203734738       7/2014
(Continued)

OTHER PUBLICATIONS

Communication pursuant to Article 94(3) EPC dated Apr. 14, 2021 in corresponding European Patent Application No. 18 843 308.0.
(Continued)

*Primary Examiner* — Joel W Fosselman
(74) *Attorney, Agent, or Firm* — Wenderoth, Lind & Ponack, L.L.P.

(57) ABSTRACT

A camera module includes a circuit board, a photosensitive element mounted on the circuit board, and a support body formed on the circuit board and surrounding the photosensitive element. The support body extends towards the photosensitive element and contacts the photosensitive element. The support body and the circuit board are fixed together to form a combined body, and the combined body has a side face including an indented surface indented towards the direction of the photosensitive element, one end of the indented surface being located at the bottom surface of the
(Continued)

circuit board. A method is used for manufacturing a camera module and an intelligent terminal with built-in camera module. The screen-to-body ratio of the intelligent terminal is increased, which allows the thickness of the intelligent terminal to be further decreased, enables easy processing, and allows for a miniaturized camera module having a good structural strength.

18 Claims, 8 Drawing Sheets

(51) Int. Cl.
*H04M 1/02* (2006.01)
*H05K 1/02* (2006.01)

(58) Field of Classification Search
USPC ....................................................... 348/207.99
See application file for complete search history.

(56) References Cited

U.S. PATENT DOCUMENTS

2017/0142303 A1    5/2017    Wang et al.
2017/0214831 A1    7/2017    Ha et al.

FOREIGN PATENT DOCUMENTS

| CN | 104767916 | 7/2015 |
|----|-----------|--------|
| CN | 104966724 | 10/2015 |
| CN | 105554352 | 5/2016 |
| CN | 106131383 | 11/2016 |
| CN | 206060925 | 3/2017 |
| CN | 107277336 | 10/2017 |
| CN | 207304699 | 5/2018 |
| EP | 1494292 | 1/2005 |
| EP | 2 372 427 | 10/2011 |
| GB | 2 438 303 | 11/2007 |
| JP | 2011-215183 | 10/2011 |
| KR | 10-2006-0020279 | 3/2006 |
| KR | 10-2008-0019883 | 3/2008 |
| KR | 10-2017-0056439 | 5/2017 |

OTHER PUBLICATIONS

International Search Report dated Sep. 25, 2018 in International (PCT) Application No. PCT/CN2018/096307.

* cited by examiner

CAMERA MODULE, MANUFACTURING METHOD THEREOF AND CORRESPONDING INTELLIGENT TERMINAL

CROSS-REFERENCE TO RELATED APPLICATIONS

This application claims priority and benefits to Chinese Patent Applications Nos. 201710666721.X and 201720978352.3, filed with the State Intellectual Property Office of China on Aug. 7, 2017, the entire contents of which are incorporated herein by reference.

FIELD OF THE INVENTION

The invention relates to technical field of camera modules and intelligent terminals.

BACKGROUND OF THE INVENTION

In recent years, full-screen mobile phones have become a foreseen mobile phone development trend. Full-screen mobile phones generally refer to mobile phones with a front screen ratio of more than 80%. The use of ultra-narrow border screens has obvious appearance advantages compared to ordinary mobile phones, and brings a more shocking visual experience to mobile phone users. It is foreseeable that many mobile phone manufacturers are willing to adopt a full-screen solution. With the rise of the full-screen trend, the front camera module of the mobile phone must be arranged on the side of the mobile phone that is very close to the side frame, such as the top and bottom sides. However, in order to increase the grip of the mobile phone, the frame or the back shell is often curved. At the same time, due to the thinner and thinner existing mobile phones, the height of the camera module cannot be reduced synchronously due to the structural and optical design requirements, so the bottom of the mobile phone module is getting closer to the back shell or the curved surface of the curved frame. When a common block-shaped camera module is placed close to the side of the mobile phone frame, the edge of the camera module near the side of the mobile phone frame or the back shell is sharp and protruded, and it will interfere with the phone frame or back shell during installation, which is not convenient to installation.

SUMMARY OF THE INVENTION

The present application aims to provide a solution capable of overcoming at least one of the aforementioned disadvantages.

According to an aspect of the present application, there is provided a camera module including: a circuit board; a photosensitive element mounted on the circuit board; and a support body formed on the circuit board and surrounding the photosensitive element, and the support body extending toward the photosensitive element and contacting the photosensitive element; wherein, the support body and the circuit board are fixed together to form a combined body, the combined body has a side surface, the side surface includes an indented surface indented toward the direction of the photosensitive element, and one end of the indented surface is located on the bottom surface of the circuit board.

In the above mentioned camera module, the indented surface is a curved surface in a stepped shape.

In the above mentioned camera module, the indented surface is a curved surface in a multi stepped shape.

In the above mentioned camera module, the indented surface is an inclined surface.

In the above mentioned camera module, the indented surface is composed of only a surface located on the circuit board.

In the above mentioned camera module, the indented surface is composed of a surface located on the circuit board and a surface located on the support body.

In the above mentioned camera module, the indented surface crosses an interface between the circuit board and the support body.

In the above mentioned camera module, the indented surface has a first end located on a bottom surface of the circuit board, and the photosensitive element has a first side closest to the indented surface; wherein, in a direction parallel to the bottom surface of the circuit board, a distance from the first end to the first side is 0.35 mm or less.

In the above mentioned camera module, the indented surface has a first end located on a bottom surface of the circuit board, and the photosensitive element has a first side closest to the indented surface; wherein, in a direction parallel to the bottom surface of the circuit board, a distance from the first end to the first side is 0.05 mm or more.

In the above mentioned camera module, the indented surface has a first end located on a bottom surface of the circuit board, and the photosensitive element has a first side closest to the indented surface; wherein, in a direction parallel to the bottom surface of the circuit board, a distance from the first end to the first side is 0.05 mm-0.35 mm.

In the above mentioned camera module, the indented surface is formed by performing a removal process on the combined body.

In the above mentioned camera module, the indented surface is formed by cutting or grinding the combined body.

In the above mentioned camera module, the support body extends towards the photosensitive element and covers at least a part of an edge region of the photosensitive element.

In the above mentioned camera module, the edge region is a region outside of an imaging region of the photosensitive element.

In the above mentioned camera module, the edge region surrounds periphery of the imaging region.

In the above mentioned camera module, the camera module has a lead wire electrically connecting the photosensitive element and the circuit board, and the support body covers the lead wire.

In the above mentioned camera module, the indented surface has a first end located on a bottom surface of the circuit board, and the circuit board has a soldering point connected to the lead wire; wherein, in a direction parallel to the bottom surface of the circuit board, a distance from the first end to the soldering point is 0.35 mm or less.

In the above mentioned camera module, the indented surface has a first end located on a bottom surface of the circuit board, and the circuit board has a soldering point connected to the lead wire; wherein, in a direction parallel to the bottom surface of the circuit board, a distance from the first end to the soldering point is 0.05 mm or more.

In the above mentioned camera module, the indented surface has a first end located on a bottom surface of the circuit board, and the circuit board has a soldering point connected to the lead wire; wherein, in a direction parallel to the bottom surface of the circuit board, a distance from the first end to the soldering point is 0.05 mm-0.35 mm.

In the above mentioned camera module, the support body is formed by a molding process.

In the above mentioned camera module, the camera module further includes an optical assembly mounted on the support body.

In the above mentioned camera module, the optical assembly includes a lens.

In the above mentioned camera module, the optical assembly includes a lens and a filter element.

According to another aspect of the present application, a method for manufacturing a camera module is further provided, including: mounting a photosensitive element on a circuit board; forming a support body surrounding the photosensitive element on the circuit board, and the support body extending toward the photosensitive element and contacting the photosensitive element to form a combined body including the support body and the circuit board; performing a removal process on the combined body so that a side surface of the combined body forms a indented surface indented toward the direction of the photosensitive element, wherein one end of the indented surface is located on a bottom surface of the circuit board; and mounting an optical assembly on the support body to produce the camera module.

In the above mentioned method for manufacturing the camera module, in the step of performing a removal process on the combined body, a cutting or grinding process is used.

In the above mentioned method for manufacturing the camera module, in the step of performing a removal process on the combined body, the combined body is cut to form the indented surface in a stepped shape or the indented surface in an inclined shape.

In the above mentioned method for manufacturing the camera module, in the step of performing a removal process on the combined body, the combined body is grinded to form the indented surface in an inclined shape.

In the above mentioned method for manufacturing the camera module, in the step of performing a removal process on the combined body, the combined body is cut from the bottom surface of the circuit board to form the indented surface.

In the above mentioned method for manufacturing the camera module, the step of performing a removal process on the combined body includes: making a groove in an edge region of the bottom surface of the circuit board, the edge region being an area other than a central region supporting the photosensitive element, the groove being formed having two side walls and a top surface connecting the two side walls; and aligning at any position on the top surface and cuting the combined body to form the side surface with the indented surface along a direction perpendicular to the bottom surface of the circuit board.

In the above mentioned method for manufacturing the camera module, in the step of making a groove in an edge region of the bottom surface of the circuit board, the depth of the groove is greater than the thickness of the circuit board.

In the above mentioned method for manufacturing the camera module, in the step of making a groove in an edge region of the bottom surface of the circuit board, the depth of the groove is equal to the thickness of the circuit board.

In the above mentioned method for manufacturing the camera module, in the step of making a groove in an edge region of the bottom surface of the circuit board, the depth of the groove is smaller than the thickness of the circuit board.

In the above mentioned method for manufacturing the camera module, in the step of forming a support body on the circuit board, the support body is formed on the circuit board by a molding process.

In the above mentioned method for manufacturing the camera module, in the step of forming a support body on the circuit board, the support body extends toward the photosensitive element and covers at least a part of the edge area of the photosensitive element.

According to yet another aspect of the present application, there is also provided an intelligent terminal, including a curved case and the above mentioned camera module; wherein, the side of the camera module having the indented surface is close to the a curved case.

In the above mentioned intelligent terminal, the intelligent terminal is a smart phone.

In the above mentioned intelligent terminal, the curved case is a curved back shell or a curved frame.

In the above mentioned intelligent terminal, the camera module is a front camera module of the smart phone.

In the above mentioned intelligent terminal, the side surface with the indented surface is close to the curved surface of the top or bottom of the curved back shell.

In the above mentioned intelligent terminal, the side surface with the indented surface is close to the curved surface of the curved frame.

The present application has at least one of the following technical effects:

1. The camera module has an indented surface near the frame or the edge of the back shell of the intelligent terminal. It will not interfere with the frame or back shell of the intelligent terminal during installation, so that the camera module can be closer to the curved frame or back shell of the intelligent terminal, thereby further increasing the screen ratio of the intelligent terminal and allowing the thickness of the intelligent terminal to be further reduced.

2. The camera module can be more easily processed, while reducing the space occupied by the bottom side, the reliability of the camera module is ensured.

3. A camera module capable of miniaturization and good structural strength can be prepared.

4. The intelligent terminal using the camera module can set the camera module at a position of the intelligent terminal which is very close to the curved frame or the back shell.

BRIEF DESCRIPTION OF THE DRAWINGS

Exemplary examples are shown in reference drawings. The exemplary examples and reference drawings disclosed herein are to be regarded as illustrative rather than restrictive.

DETAIL DESCRIPTION OF THE INVENTION

Figure 1:
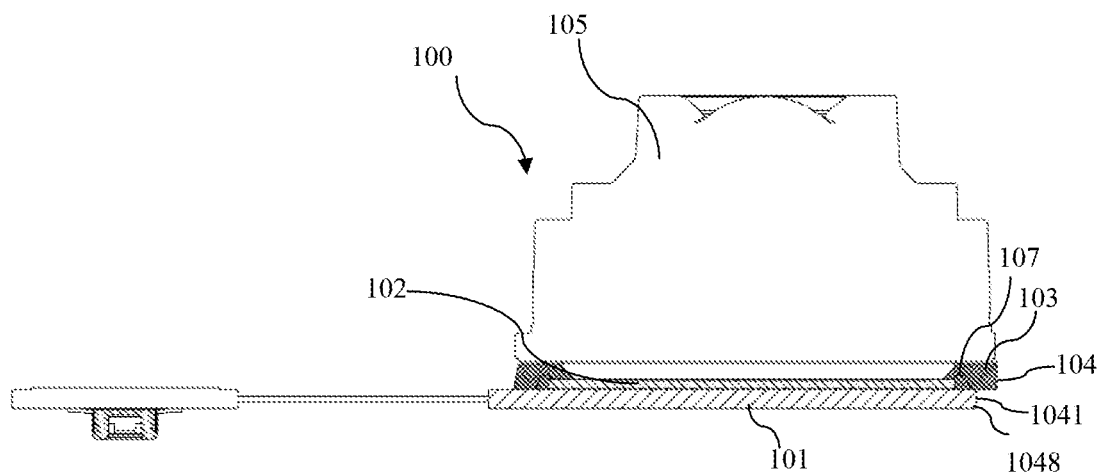
FIG. 1 illustrates an embodiment of a camera module provided by the present application.

In order to better understand the present application, various aspects of the present application will be described in more detail with reference to the accompanying drawings. It should be understood that these detailed descriptions are merely descriptions of exemplary examples of the present application, and do not limit the scope of the present application in any way. Throughout the description, the same reference numerals refer to the same elements. The expression "and/or" includes any and all combinations of one or more of the associated listed items.

It should be noted that in this description, the expressions of the first, second, etc. are only used to distinguish one feature from another feature, and do not indicate any limitation on the feature. Therefore, without departing from the teachings of this application, the first subject discussed below may also be referred to as the second subject.

In the accompanying drawings, for convenience of explanation, the thickness, size, and shape of the object have been slightly exaggerated. The accompanying drawings are only examples and are not drawn strictly to scale.

It should be understood that the terms "include", "including", "have", "contain" and/or "containing" used in this specification indicate the existence of stated features, wholes, steps, operations, elements and/or components, but does not exclude the presence or addition of one or more other features, wholes, steps, operations, elements, components and/or combinations thereof. Furthermore, when an expression such as "at least one of . . . " appears before the list of listed features, the entire listed feature is refined, rather than the individual elements in the list. In addition, when describing examples of the present application, "may" is used to mean "one or more examples of the present application." Also, the term "exemplary" is intended to refer to an example or illustration.

As used herein, the terms "substantially", "approximately" and similar terms are used as a word for approximation, not as a word for degree, and are intended to illustrate inherent deviations in measured or calculated values that will be recognized by those of ordinary skilled in the art.

Unless otherwise defined, all terms (including technical and scientific terms) used herein have the same meaning as commonly understood by those of ordinary skilled in the art to which this application belongs. It should also be understood that terms (such as those defined in commonly used dictionaries) should be interpreted to have meanings consistent with their meaning in the context of the relevant technology and will not be interpreted in an idealized or overly formal sense, unless this is clearly defined herein.

It should be noted that, in the case of no conflict, the embodiments in the present application and the features in the embodiments can be combined with each other. The application will be described in detail below with reference to the accompanying drawings and embodiments.

FIG. 1 illustrates an embodiment of the camera module provided by the present application. The camera module 100 includes a circuit board 101, a photosensitive element 102, a support body 103, and an optical assembly 105. Wherein, the circuit board 101 has a first surface and an opposite second surface, and the photosensitive element 102 is mounted on the first surface of the circuit board 101. The second surface serves as the bottom surface of the circuit board 101 (herein, the bottom surface of the circuit board refers to the second surface). The support body 103 is formed on the circuit board 101 and surrounds the photosensitive element 102, and the support body 103 extends toward the photosensitive element 102 and contacts the photosensitive element 102, so that there is no gap between the support body 103 and a side surface of the photosensitive element 102. The optical assembly 105 includes a lens and/or a color filter element. The optical assembly 105 is mounted on the supporting body 103 to form a complete camera module.

In this embodiment, the supporting body 103 is manufactured on the circuit board 101 by a molding process, and the supporting body 103 and the circuit board 101 are fixed together to form a combined body. The combined body has a side surface 104, the side surface 104 includes a indented surface 1041 indented toward the direction of the photosensitive element, and one end of the indented surface 1041 (for example, the first end 1048 shown in FIG. 1) is located on the bottom surface of the circuit board 101. In this embodiment, the indented surface 1041 is a curved surface in a single-stepped state.

The camera module 100 of this embodiment is particularly suitable for an intelligent terminal having an curved case. Since the camera module 100 has an indented surface 1041 near the edge of a side of the frame or the back shell of the intelligent terminal, the camera module 100 does not interfere with the frame or the back shell of the intelligent terminal when it is mounted. Thus, the curved frame or back shell of the intelligent terminal is closer, thereby further increasing the screen ratio of the intelligent terminal and allowing the thickness of the intelligent terminal to be further reduced.

Figure 2:
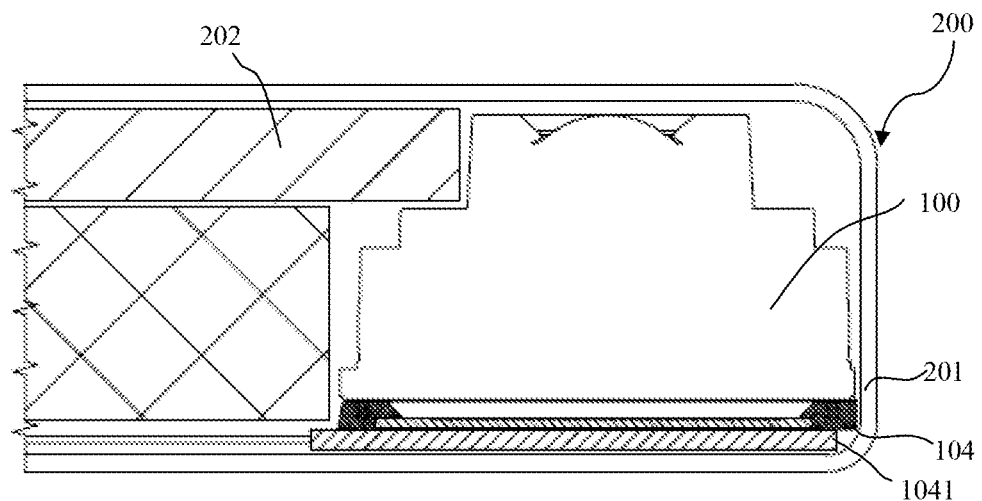
FIG. 2 is a schematic diagram showing that the camera module 100 of the embodiment in FIG. 1 is mounted in an intelligent terminal 200 having a curved case.

FIG. 2 is a schematic diagram showing the camera module 100 of the embodiment in FIG. 1 being mounted in an intelligent terminal 200 having a curved case. This drawing is a schematic partial cross-sectional view of the intelligent terminal 200 in a horizontally placed state, with the front of the intelligent terminal 200 facing up and the top on the right side. Referring to FIG. 2, in the intelligent terminal 200, the camera module 100 is a front camera module, and the orientation of the lens is the same as that of the screen 202. The side surface 104 of the camera module 100 having the indented surface 1041 is close to the curved case 201, so that the camera module 100 can be as close to the top or bottom of the mobile phone as possible, thereby increasing the screen ratio.

Figure 3:
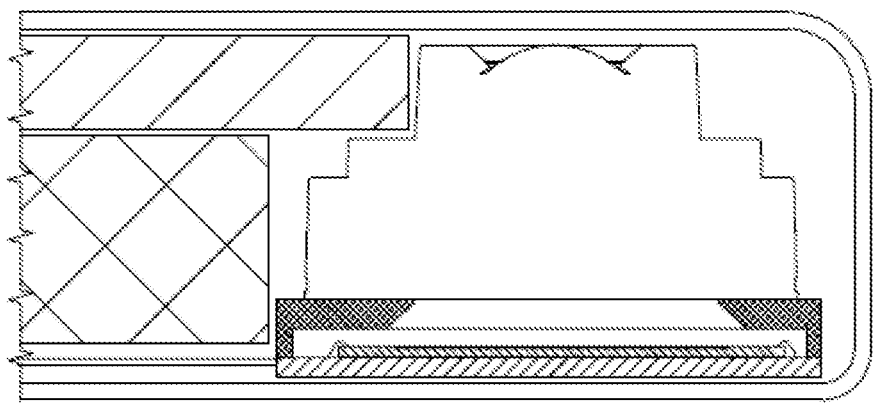
FIG. 3 is a schematic diagram showing a conventional camera module mounted in an intelligent terminal with a curved case.

FIG. 3 is a schematic diagram showing a conventional camera module mounted in an intelligent terminal with a curved case. It can be seen that the side surface of the conventional camera module cannot be close to the curved case of the intelligent terminal, which makes it difficult to increase the screen ratio.

Figure 4:
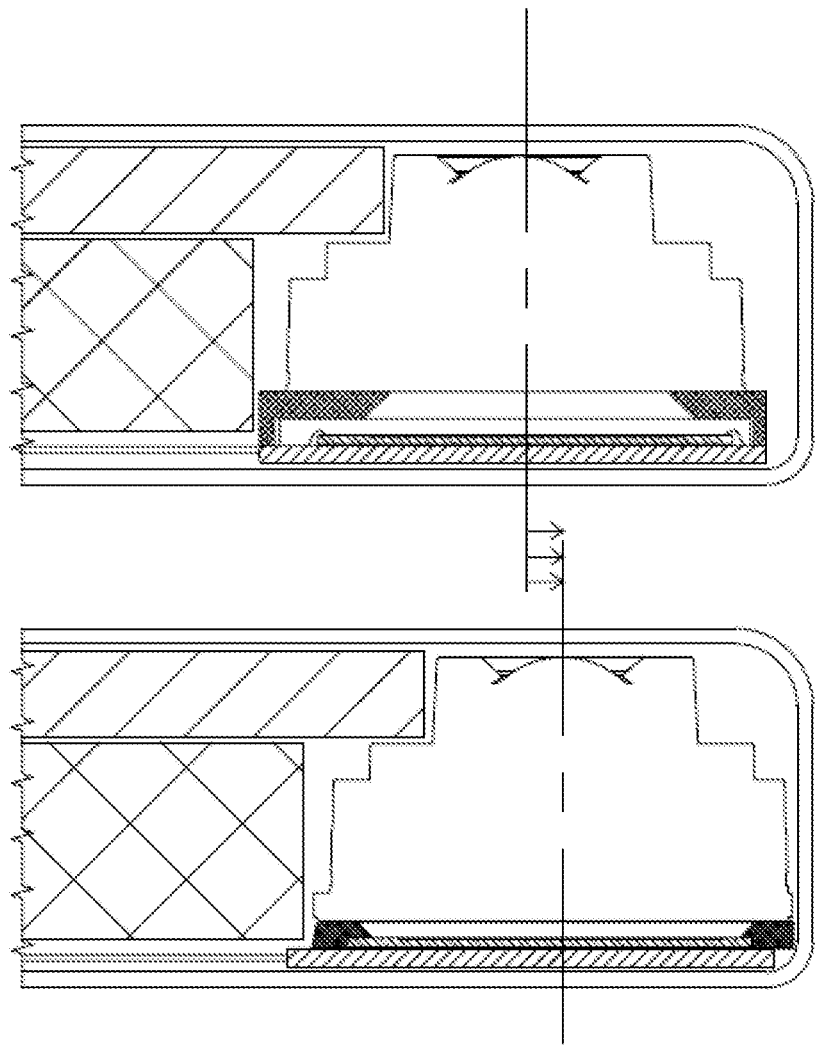
FIG. 4 is a schematic diagram showing a comparison between an intelligent terminal (a lower side intelligent terminal) with a built-in camera module of the embodiment of FIG. 1 and an intelligent terminal (an upper side intelligent terminal) with a built-in conventional camera module.
Figure 5:
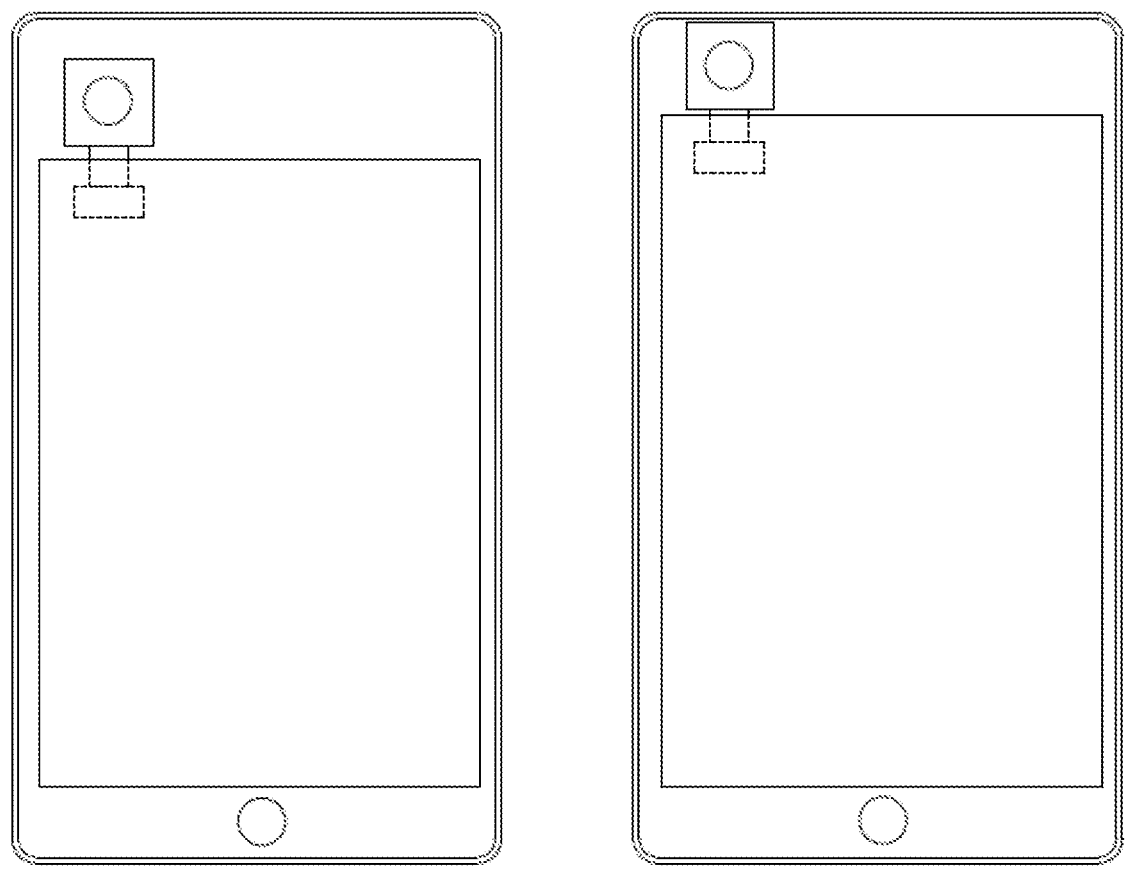
FIG. 5 is a schematic diagram showing a comparison of screen ratios of an intelligent terminal (a right-side intelligent terminal) with a built-in camera module in the embodiment of FIG. 1 and an intelligent terminal (a left-side intelligent terminal) with a built-in conventional camera module.

Further, FIG. 4 is a schematic diagram showing a comparison between an intelligent terminal (a lower side intelligent terminal) with a built-in camera module in the embodiment of FIG. 1 and an intelligent terminal (an upper side intelligent terminal) with a built-in conventional camera module. It can be seen that the camera module in the embodiment of FIG. 1 is closer to the curved case of the intelligent terminal than the conventional camera module, so that the mounting position of the camera module can be closer to the top of the intelligent terminal. FIG. 5 is a schematic diagram showing a comparison of screen ratios of an intelligent terminal (a right-side intelligent terminal) with a built-in camera module in the embodiment of FIG. 1 and an intelligent terminal (a left-side intelligent terminal) with a built-in conventional camera module. It can be seen that since the mounting position of the camera module is closer to the top of the intelligent terminal, the intelligent terminal with the built-in camera module in the embodiment of FIG. 1 increases the screen ratio.

Figure 6:
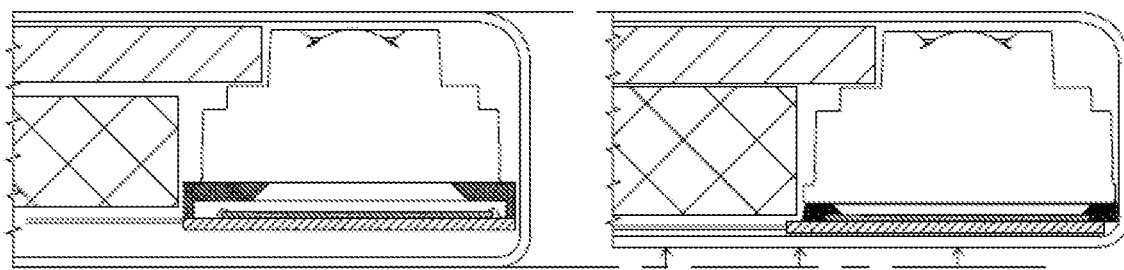
FIG. 6 is a schematic diagram showing a comparison between an intelligent terminal (a right-side intelligent terminal) with a built-in camera module in the embodiment of FIG. 1 and another intelligent terminal (a left-side intelligent terminal) with a built-in conventional camera module.

Further, the camera module in the embodiment of FIG. 1 also helps to reduce the thickness of the intelligent terminal. FIG. 6 is a schematic diagram showing a comparison between an intelligent terminal (a right-side intelligent terminal) with the built-in camera module of the embodiment in FIG. 1 and another intelligent terminal (a left-side intelligent terminal) with a built-in conventional camera module. In the intelligent terminal (the left-side intelligent terminal) with the built-in conventional camera module, a side surface of the conventional camera module is close to the non-curved part of the case of the intelligent terminal, resulting in that the bottom surface of the circuit board cannot be close to or support the back shell of the intelligent terminal. The camera module in the embodiment of FIG. 1 can solve this problem well, thereby allowing the thickness of the intelligent terminal to be further reduced.

Figure 7:
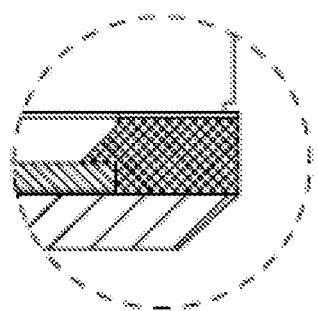
FIG. 7 is an enlarged schematic diagram showing an area near an indented surface 1041 in another embodiment of the present application.

The indented surface 1041 of the camera module in the embodiment of FIG. 1 uses a curved surface in a single-stepped state, but this shape is not unique. For example, FIG. 7 is an enlarged schematic diagram showing a area near the indented surface 1041 in another embodiment of the present application. In this embodiment, the indented surface 1041 is an inclined surface. The inclined surface can be obtained by cutting or grinding the circuit board 101. It is easy to think that the indented surface may also be a curved surface in a multi-stepped state.

Figure 8:
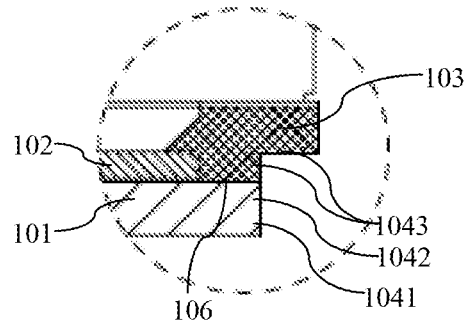
FIGS. 8 to 10 are enlarged schematic diagrams showing the area near the indented surface 1041 in several other embodiments of the present application.
Figure 9:
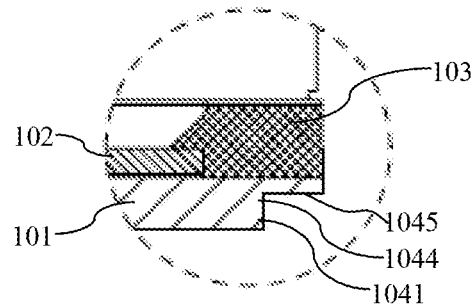
Figure 10:
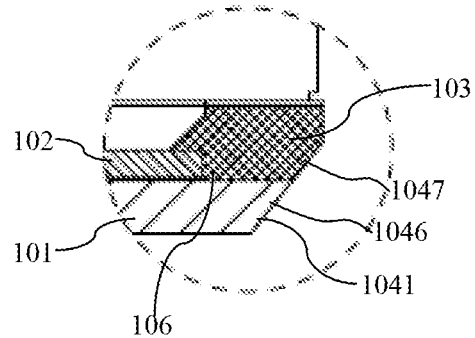

Further, FIG. 8 to FIG. 10 are enlarged schematic diagrams showing the area near the indented surface 1041 in several other embodiments of the present application. In the embodiment of FIG. 8, the indented surface 1041 is a curved surface in a single-stepped state, and is composed of a surface 1042 on the circuit board 101 and a surface 1043 on the support body 103. The indented surface 1041 crosses the interface 106 between the circuit board 101 and the support body 103. The indented surface 1041 can be obtained by cutting the circuit board 101 and the support body 103.

In the embodiment of FIG. 9, the indented surface 1041 is a curved surface in a single-stepped state, and is composed of only two surfaces 1044 and 1045 on the circuit board 101. The indented surface 1041 can be obtained by cutting the circuit board 101 and the support body 103.

In the embodiment of FIG. 10, the indented surface 1041 is an inclined surface, and is composed of a surface 1046 on the circuit board 101 and a surface 1047 on the support body 103. The indented surface 1041 crosses the interface 106 between the circuit board 101 and the support body 103. The indented surface 1041 can be obtained by cutting or grinding the circuit board 101 and the supporting body 103.

Figure 11:
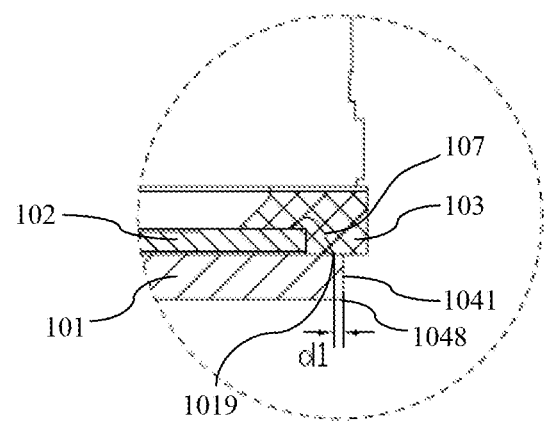
FIG. 11 is an enlarged schematic diagram showing the area near the indented surface according to another embodiment of the present application.

Further, FIG. 11 is an enlarged schematic diagram showing a area near a indented surface according to another embodiment of the present application. In this embodiment, the camera module has a lead wire 107 (e.g., a gold wire) electrically connecting the photosensitive element 102 and the circuit board 101, and the support body 103 covers the lead wire 107 during molding. The indented surface 1041 has a first end 1048 on the bottom surface of the circuit board, and the circuit board 101 has a soldering point 1019 connected to the lead wire 107. In a direction parallel to the bottom surface of the circuit board 101, a distance d1 between the first end 1048 and the soldering point 1019 may be preferably 0.05 mm-0.35 mm. On one hand, this distance can better avoid the lead wire 107 (e.g., gold wires) and avoid damage to the camera module due to the manufacturing tolerances of the removal process. On the other hand, the indented surface can be used more fully to further improve the screen ratio of the intelligent terminal or reduce the thickness of the intelligent terminal.

Figure 12:
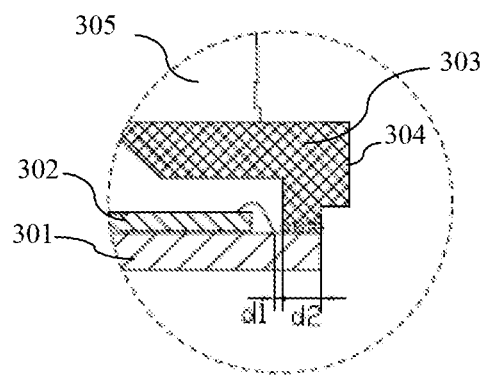
FIG. 12 is an enlarged schematic diagram showing a area near a side surface 304 of a combined body of a comparative embodiment.
Figure 13:
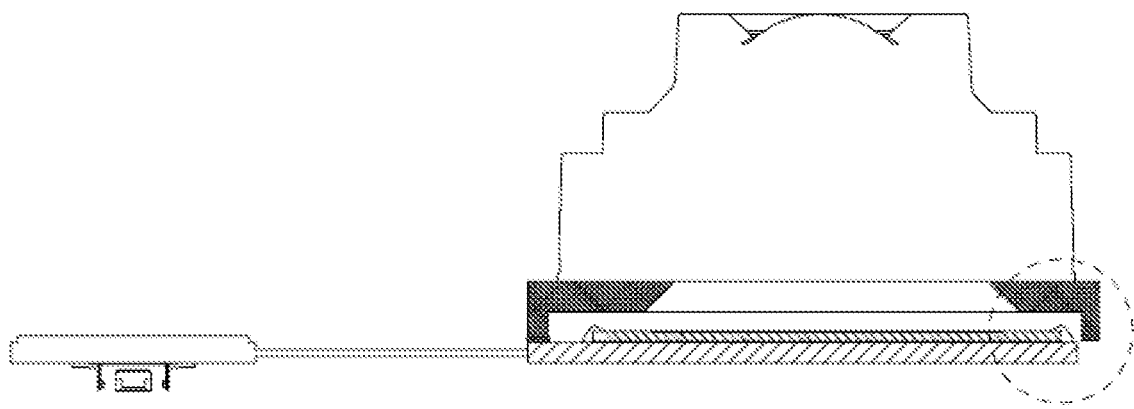
FIG. 13 is a diagram showing an effect of cutting the camera module of the comparative embodiment of FIG. 12.

FIG. 12 is an enlarged schematic view showing the area near a side surface 304 of a combined body of a comparative embodiment. In this comparative embodiment, a conventional lens holder 303 is mounted on a circuit board 301 in an adhesive manner using a conventional dispensing process. In order to avoid the gold wire, a sufficient gap needs to be left between the conventional lens holder 303 and a photosensitive element 302. At the same time, the conventional lens holder 303 needs to have a sufficient width d2 to provide support for other components (such as an optical assembly 305 or the circuit board 301) to prevent the camera module from deforming during manufacturing, mounting or usage, and it is also necessary to encapsulate the photosensitive element 302 to prevents dust from entering. To meet the above requirements, the width d2 of the conventional lens holder 303 must not be too small, which results in a longer distance from the side surface 304 of the combined body to the photosensitive element 302, which is not beneficial for the miniaturization of the camera module and cannot achieve the effect of increasing the screen ratio of the intelligent terminal or reducing the thickness of the intelligent terminal. In the embodiment of FIG. 11, the supporting body 103 extends toward the photosensitive element 102 and covers at least a part of the edge region of the photosensitive element 102. Since there is no gap between the support body 103 and the photosensitive element 102, the side surface 104 of the combined body of the embodiment of FIG. 11 can be closer to the photosensitive element 102 compared to the comparative embodiment. Further, the combined body can also be cut or grinded to form an indented surface 1041 indented toward the direction of the photosensitive element 102, thereby further achieving the effect of increasing the screen ratio of the intelligent terminal or reducing the thickness of the intelligent terminal. As for the camera module in the comparative embodiment, it is difficult to cut or grind the combined body. FIG. 13 is a diagram showing an effect of cutting the camera module of the comparative embodiment of FIG. 12. It can be seen that the cut camera module cannot be sealed, which may cause problems such as water leakage.

Figure 14:
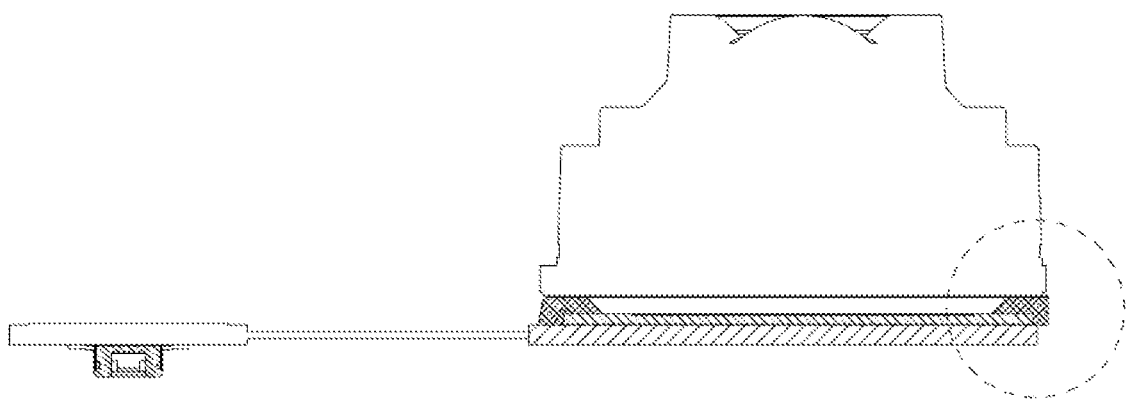
FIG. 14 is a schematic diagram showing another embodiment of the present application.
Figure 15:
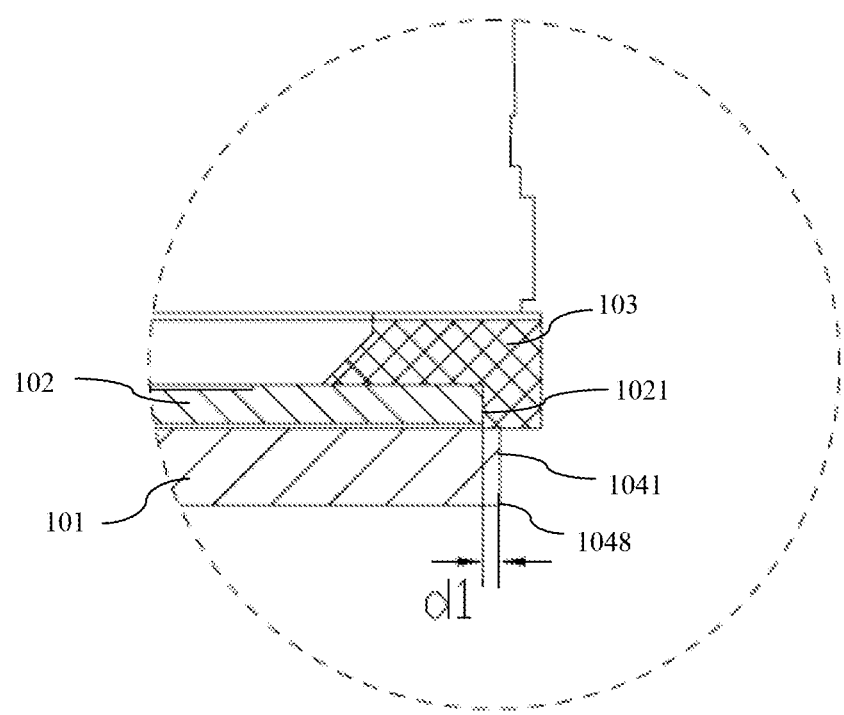
FIG. 15 is an enlarged view showing a area near an indented surface in the embodiment of FIG. 14.

Further, FIG. 14 is a schematic diagram showing another embodiment of the present application. FIG. 15 is an enlarged view showing an area near an indented surface in the embodiment of FIG. 14. In this embodiment, there is no gold wire near the indented surface (for embodiment, a lead wire is arranged on other side surface of the combined body, so that the area near the side surface including the indented surface is free of gold wire). Referring to FIG. 15, the photosensitive element 102 has a first side 1021 closest to the indented surface 1041, and the indented surface 1041 has a first end 1048 located on a bottom surface of the circuit board 101. Wherein, in a direction parallel to the bottom surface of the circuit board, a distance d1 between the first end 1048 and the first side 1021 is 0.05 mm-0.35 mm. On one hand, this distance can better avoid the photosensitive element 102 and avoid damage to the camera module due to the manufacturing tolerances of the removal process. On the other hand, the indented surface can be used more fully to further increase the screen ratio of the intelligent terminal or reduce the thickness of the intelligent terminal.

Figure 16:
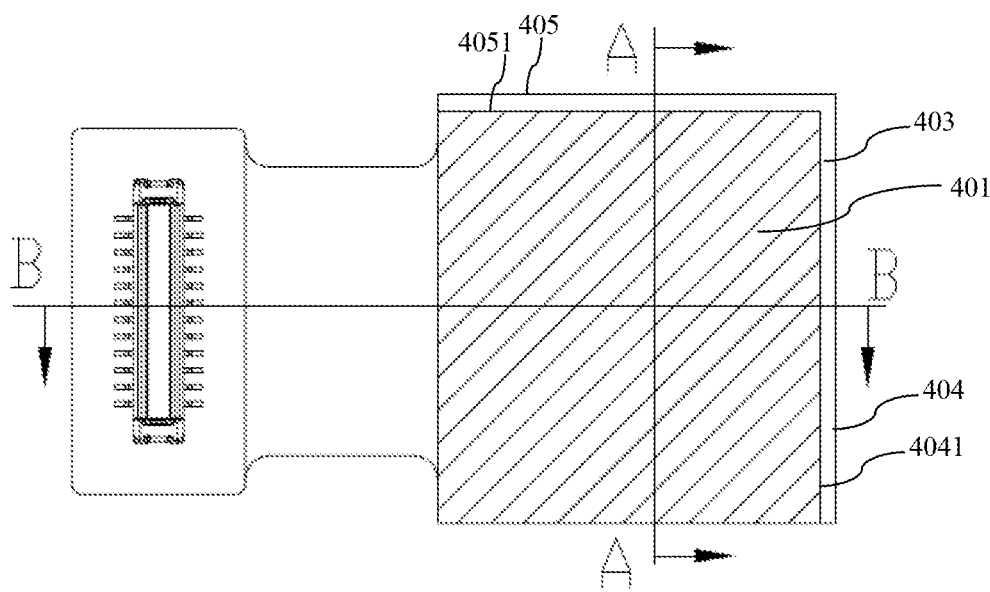
FIG. 16 is a bottom view of a camera module according to another embodiment of the present application.
Figure 17:
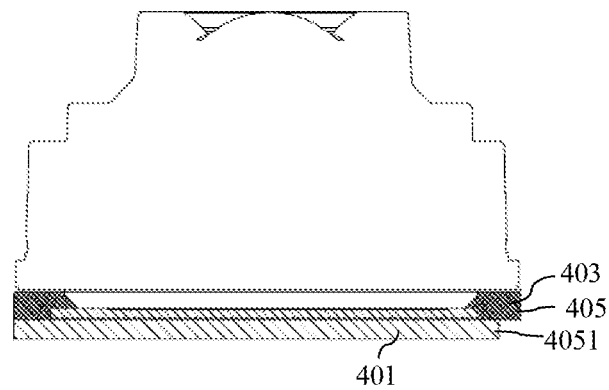
FIG. 17 is a schematic diagram showing an A-A section of the embodiment of FIG. 16.
Figure 18:
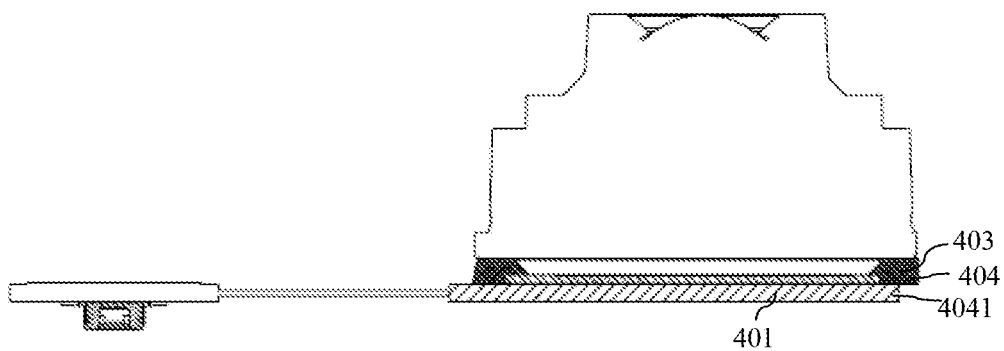
FIG. 18 is a schematic diagram showing a B-B section of the embodiment of FIG. 16.

Further, FIG. 16 is a bottom view showing a camera module according to another embodiment of the present application. FIG. 17 is a schematic diagram showing an A-A cross section of the embodiment in FIG. 16. FIG. 18 is a schematic diagram showing a B-B cross section of the embodiment in FIG. 16. Referring to FIGS. 16-18, a circuit board 401 and a supporting body 403 constitute a combined body, which includes a first side surface 404 having a first indented surface 4041 and a second side surface 405 having a second indented surface 4051. This design with two indented surfaces provided on both side surfaces can increase the screen ratio of the intelligent terminal and reduce the thickness of the intelligent terminal, while making the internal structure of the intelligent terminal more compact. Accordingly, in other embodiments, the combined body may further have more side surfaces including an indented surface. For embodiment, the combined body may have three side surfaces including an indented surface.

Further, in an embodiment of the present application, the edge region is a region outside of an imaging region of the photosensitive element. The edge region surrounds the imaging region.

Further, according to another embodiment of the present application, a method for manufacturing a camera module is further provided, including:

Step 1: mounting a photosensitive element on a circuit board. In this embodiment, the photosensitive element can be mounted on the circuit board in an adhesive manner.

Step 2: forming a support body surrounding the photosensitive element on the circuit board, and the support body extending toward the photosensitive element and contacting the photosensitive element to form a combined body including the support body and the circuit board. In this embodiment, the supporting body may be manufactured on the circuit board by a molding process.

Step 3: performing a removal process on the combined body so that a side surface of the combined body forms an indented surface indented toward the direction of the photosensitive element, wherein one end of the indented surface is located on a bottom surface of the circuit board.

Step 4: mounting an optical assembly on the support body to produce the camera module.

Further, in an embodiment of the present application, in step 3, the removing process is a cutting or grinding process.

Further, in an embodiment of the present application, in the step 3, the combined body is cut to form the indented surface in a stepped state or the indented surface in an inclined surface state.

Further, in an embodiment of the present application, in the step 3, the combined body is grinded to form the indented surface in an inclined surface state.

Further, in an embodiment of the present application, in step 3, the combined body is cut from the bottom surface of the circuit board to form the indented surface.

Figure 19:
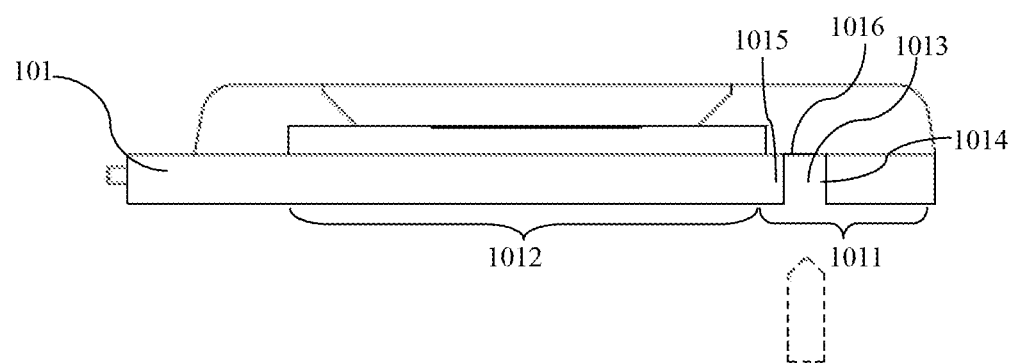
FIG. 19 is a schematic diagram showing that a groove is formed on a bottom surface of a circuit board in a method for manufacturing a camera module according to an embodiment of the present application.

Further, in an embodiment of the present application, the step 3 includes:

Step 31: making a groove in an edge region 1011 of the bottom surface of the circuit board 101. FIG. 19 is a schematic diagram showing that a groove is formed on a bottom surface of a circuit board in a method for manufacturing a camera module according to an embodiment of the present application. The edge region 1011 being an area outside of a central region 1012 supporting the photosensitive element, the groove 1013 being formed having two side walls 1014 and 1015, and a top surface 1016 connecting the two side walls 1014 and 1015.

Figure 20:
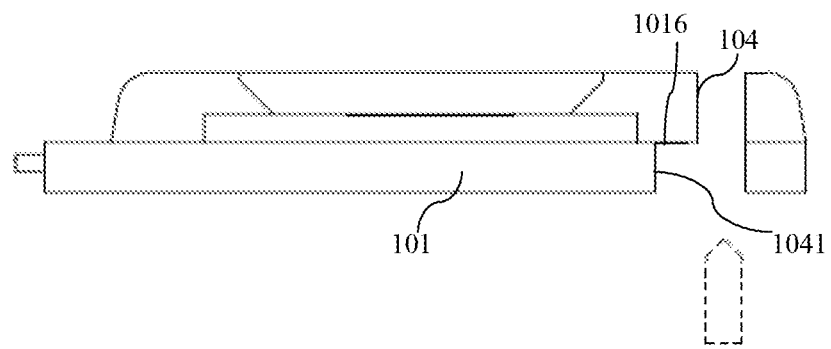
FIG. 20 is a schematic diagram showing that cutting is completed in a method for manufacturing a camera module according to an embodiment of the present application.

Step 32: cutting the side surfaces of the combined body. FIG. 20 is a schematic diagram showing that cutting is completed in a method for manufacturing a camera module according to an embodiment of the present application. Specifically, in this step, aligning at any position on the top surface 1016 and cuting the combined body to form the side surface 104 with the indented surface 1041 along a direction perpendicular to the bottom surface of the circuit board 101.

Further, in an embodiment of the present application, in step 31, the depth of the groove is greater than the thickness of the circuit board 101, so that the top surface 1016 is located on the support body 103.

In another embodiment of the present application, in the step 31, the groove depth is equal to the thickness of the circuit board 101, so that the top surface 1016 is located at an interface between the support body 103 and the circuit board 101.

In another embodiment of the present application, in step 31, the depth of the groove depth is smaller than the thickness of the circuit board 101, so that the top surface 1016 is located on the circuit board 101.

In an embodiment of the present application, in step 2, when the support body is molded, the support body extends towards the photosensitive element and covers at least a part of the edge region of the photosensitive element.

In another embodiment of the present application, an intelligent terminal with a built-in camera module with an indented surface is also provided. The intelligent terminal includes a curved case and a camera module in any of the foregoing embodiments. Wherein, the side surface of the camera module having the indented surface is close to the curved case. The intelligent terminal may be a smart phone, or of course, other smart devices such as a tablet computer. The curved case may be a curved back shell or a curved frame.

In an embodiment of the present application, the camera module may be a front camera module of a smart phone.

In an embodiment of the present application, the side surface of the camera module having the indented surface is close to the curved surface of the top or bottom of the curved back shell.

In another embodiment of the present application, the side surface with the indented surface is close to the curved surface of the curved frame.

The above description is only the preferred embodiment of the present application and the explanation of the applied technical principles. Those skilled in the art should understand that the scope of the invention involved in this application is not limited to the technical solution of the specific combination of the above technical features, but also covers other equivalent solutions formed by any combination of the above technical features without departing from the concept of the present application. For example, a technical solution can be formed by replacing the above features with technical features disclosed in the present application (but not limited to) having similar functions.

The invention claimed is:

1. A camera module, comprising:
a circuit board;
a photosensitive element mounted on the circuit board; and
a support body formed on the circuit board, the support body surrounding the photosensitive element, extending toward the photosensitive element and contacting the photosensitive element,
wherein the support body and the circuit board are fixed together to form a combined body, the combined body has a side surface, the side surface includes an indented surface indented toward a direction of the photosensitive element, and one end of the indented surface is located on a bottom surface of the circuit board,
wherein the support body extends toward the photosensitive element and covers at least a part of an edge region of the photosensitive element, and
wherein the camera module has a lead wire electrically connecting the photosensitive element and the circuit board, and the support body covers the lead wire.

2. The camera module according to claim 1, wherein the indented surface is a curved surface in a stepped shape.

3. The camera module according to claim 2, wherein the indented surface is a curved surface in a multi-stepped shape.

4. The camera module according to claim 1, wherein the indented surface is an inclined surface.

5. The camera module according to claim 1, wherein the indented surface is composed of only a surface located on the circuit board.

6. The camera module according to claim 1, wherein the indented surface is composed of a surface located on the circuit board and a surface located on the support body.

7. The camera module according to claim 6, wherein the indented surface crosses an interface between the circuit board and the support body.

8. The camera module according to claim 1, wherein the indented surface has a first end located on the bottom surface of the circuit board,
the photosensitive element has a first side closest to the indented surface and in a direction parallel to the bottom surface of the circuit board, and
a distance from the first end to the first side is 0.35 mm or less, or is 0.05 mm or more, or is 0.05 mm-0.35 mm.

9. The camera module according to claim 1, wherein the indented surface is formed by performing a removal process on the combined body.

10. The camera module according to claim 9, wherein the indented surface is formed by cutting or grinding the combined body.

11. The camera module according to claim 1, wherein the edge region is a region outside of an imaging region of the photosensitive element.

12. The camera module according to claim 11, wherein the edge region surrounds a periphery of the imaging region.

13. The camera module according to claim 1, wherein
the indented surface has a first end located on the bottom surface of the circuit board,
the circuit board has a soldering point connected to the lead wire, and in a direction parallel to the bottom surface of the circuit board, and
a distance from the first end to the soldering point is 0.35 mm or less, or is 0.05 mm or more, or is 0.05 mm-0.35 mm.

14. The camera module according to claim 1, wherein the support body is formed by a molding process.

15. The camera module according to claim 1, wherein the camera module further comprises an optical assembly mounted on the support body.

16. A method for manufacturing a camera module, the method comprising:
mounting a photosensitive element on a circuit board;
forming a support body surrounding the photosensitive element on the circuit board, the support body extending toward the photosensitive element and contacting the photosensitive element to form a combined body including the support body and the circuit board;
performing a removal process on the combined body so that a side surface of the combined body forms an indented surface indented toward a direction of the photosensitive element, one end of the indented surface being located on a bottom surface of the circuit board; and
mounting an optical assembly on the support body to produce the camera module,
wherein the support body extends toward the photosensitive element and covers at least a part of an edge region of the photosensitive element, and
wherein the camera module has a lead wire electrically connecting the photosensitive element and the circuit board, and the support body covers the lead wire.

17. The method for manufacturing a camera module according to claim 16, wherein the performing of the removal process on the combined body comprises:
making a groove in an edge region of the bottom surface of the circuit board, the edge region being an area outside of a central region carrying the photosensitive element, the groove being formed having two side walls and a top surface connecting the two side walls; and
aligning at any position on the top surface and cutting the combined body to form the side surface with the indented surface along a direction perpendicular to the bottom surface of the circuit board.

18. An intelligent terminal, comprising a curved case and the camera module according to claim 1,
wherein a side of the camera module having the indented surface is close to the curved case.

* * * * *